US009510467B2

(12) United States Patent
McIntyre et al.

(10) Patent No.: US 9,510,467 B2
(45) Date of Patent: Nov. 29, 2016

(54) APPARATUS FOR HOLDING A PORTABLE DEVICE

(71) Applicants: Michael Todd McIntyre, La Quinta, CA (US); Jeffrey Stephen Berg, La Quinta, CA (US); Jeffrey Mark Spillman, La Quinta, CA (US)

(72) Inventors: Michael Todd McIntyre, La Quinta, CA (US); Jeffrey Stephen Berg, La Quinta, CA (US); Jeffrey Mark Spillman, La Quinta, CA (US)

( * ) Notice: Subject to any disclaimer, the term of this patent is extended or adjusted under 35 U.S.C. 154(b) by 0 days.

(21) Appl. No.: 14/207,356

(22) Filed: Mar. 12, 2014

(65) Prior Publication Data

US 2015/0264824 A1 Sep. 17, 2015

Related U.S. Application Data

(63) Continuation of application No. 13/252,167, filed on Oct. 3, 2011, now abandoned.

(60) Provisional application No. 61/389,268, filed on Oct. 3, 2010.

(51) Int. Cl.
| | |
|---|---|
| *A47F 5/00* | (2006.01) |
| *H05K 5/02* | (2006.01) |
| *F16M 11/04* | (2006.01) |
| *F16M 11/10* | (2006.01) |
| *F16M 11/20* | (2006.01) |
| *F16M 13/00* | (2006.01) |
| *F16B 2/22* | (2006.01) |
| *H05K 5/00* | (2006.01) |

(52) U.S. Cl.
CPC .............. *H05K 5/0204* (2013.01); *F16B 2/22* (2013.01); *F16M 11/04* (2013.01); *F16M 11/041* (2013.01); *F16M 11/10* (2013.01); *F16M 11/2028* (2013.01); *F16M 13/00* (2013.01); *H05K 5/0086* (2013.01)

(58) Field of Classification Search
CPC .. H05K 5/0204; H05K 5/0086; F16M 11/84; F16M 11/041; F16M 11/04; F16M 11/10; F16M 11/2028; F16M 13/00; F16B 2/22
USPC ............ 248/121, 310, 441.1, 447, 450, 673, 248/677, 688, 918; 361/679.03
See application file for complete search history.

(56) References Cited

U.S. PATENT DOCUMENTS

| | | | | |
|---|---|---|---|---|
| 5,480,119 | A * | 1/1996 | Fish .................. | A47B 19/08 108/127 |
| 7,922,137 | B2 * | 4/2011 | Derry et al. ............... | 248/274.1 |
| D658,651 | S * | 5/2012 | Lee et al. .................... | D14/452 |
| 8,240,628 | B2 * | 8/2012 | Huang ....................... | 248/316.1 |
| 8,789,800 | B2 * | 7/2014 | Liu ............................. | 248/122.1 |
| D724,598 | S * | 3/2015 | Gelsomini et al. .......... | D14/447 |
| 8,979,040 | B2 * | 3/2015 | Chien et al. ............... | 248/122.1 |
| 9,022,337 | B2 * | 5/2015 | Petruskavich ............ | 248/316.4 |
| 9,074,725 | B2 * | 7/2015 | Trotsky ............... | F16M 11/043 |
| 2012/0074272 | A1 * | 3/2012 | Hull ........................... | 248/122.1 |
| 2013/0092811 | A1 * | 4/2013 | Funk et al. ................. | 248/371 |
| 2013/0105644 | A1 * | 5/2013 | Yu ............................... | 248/125.7 |
| 2013/0135803 | A1 * | 5/2013 | Johnson et al. ......... | 361/679.01 |

* cited by examiner

*Primary Examiner* — Gwendolyn W Baxter
(74) *Attorney, Agent, or Firm* — Frederic M. Douglas

(57) ABSTRACT

A method and apparatus for supporting a portable computer appliance. The invention may comprise rotating a computer appliance to convert between mouse-based use and a touch-based use, or other orientations and applications. The apparatus may be attached to a microphone stand or similar mechanism to aid viewing the computer appliance. To assist coordination with public performances, the apparatus may hold and support a computer appliance to display notes, music, video, or other expressions for assisting a performer, such as for public speeches, concerts, plays, stand-up comedy, and the like.

18 Claims, 6 Drawing Sheets

APPARATUS FOR HOLDING A PORTABLE DEVICE

CROSS-REFERENCE TO RELATED APPLICATION

The application is a continuation of U.S. patent application Ser. No. 13/1,252,167, filed on Oct. 3, 2011, currently pending, with no change in inventorship, which is incorporated herein by reference. The application claims priority from U.S. Provisional Patent Application No. 61/389,268, filed on Oct. 3, 2010, the contents of which are incorporated herein by reference.

BACKGROUND OF THE INVENTION

The present invention relates generally to cases or holders for portable electronic devices, as well as the devices themselves. Such devices may include mobile telephones, personal digital assistants (PDAs), portable video/music players, electronic books, electronic book readers, tablet computers, portable gaming devices, and the like. Some of such devices include the iPad (trademarked by Apple, Inc.), the iPod (trademarked by Apple, Inc.). the iPhone (trademarked by Apple, Inc.), the BlackBerry (trademarked by RIM, Inc.), the Android (trademarked by Google, Inc.), and other portable devices.

The invention also relates to a versatile protective holder that allows attachment to a microphone stand for optional hands-free viewing, with full adjustment of viewing orientation in portrait and/or landscape orientations, directional sound reflecting and baffling, easier grasping by the user as well as attachment to an automobile, motorcycle, boat, or other vehicle.

Portable devices are increasingly used for multiple tasks that range from telephony to video to computing to audio and other entertainment and instructional uses, While some users prefer to carry such devices in clothing pockets, handbags, and elsewhere, others have a need to clip the device to a support for hands-free use. One example is when making a public speech; a speaker would like to have a portable device near eye level or at another level for convenience while speaking. Another need is for musical performers. Often, a musician needs their hands free for playing an instrument but they also need to refer to lyrics, sheet music, song lists, and the like.

Portable devices are increasingly used for multiple tasks that range from telephony to video to computing to audio and other entertainment and instructional uses. Portable devices may be used to facilitate communication, including via a communication service. Such devices may include mobile telephones, personal digital assistants (PDAs), portable video/music players, electronic books, electronic book readers, tablet computers, portable gaming devices, and the like. Some of such devices include the iPad (trademarked by Apple, Inc.), the iPod (trademarked by Apple, Inc.), the iPhone (trademarked by Apple, Inc.), the Blackberry (trademarked by RIM, Inc.), the Android (trademarked by Google, Inc.), Android-based devices, and other portable devices.

Another needed feature is to easily and swiftly attach and remove a portable device from a music stand, microphone stand, and such other structures commonly present in venues for public meetings.

It would be advantageous to provide a holder for portable devices that would include one, or more of the features of 1) minimized screen blockage to facilitate easy one-handed cleaning; 2) resilient side gripping members that clamp around the device to protect the device without obscuring the display or controls; 3) easy to hold shape; 4) allowing the device to be supported in a portrait, landscape, or other orientation without compromising usability; 5) detachable spring biasing for ease of attachment and removal; 6) an attractive aesthetic appearance, and 7) a slim, low-profile design.

SUMMARY OF THE INVENTION

In one aspect of the present invention, a device supporter may comprise a body, including a pair of coupling members and a cradling member, each of the coupling members extending from the body, the coupling members configured to couple a portable device to the body in a spring biasing relationship; an engaging member, configured for releasable engagement with a microphone stand, the engaging member extending substantially orthogonally in relation to the coupling members; and a cradling member, integrally situated distally from the coupling members, configured to cradle the portable device in a spring biasing relationship.

In another aspect of the present invention, the body may include a plurality of corners and each of the coupling members may be situated proximate to one of the corners.

In a further aspect of the present invention, the body includes a D-shaped aperture situated between the engaging member and the cradling member.

In a still further aspect of the present invention, the cradling members comprise gripping members extending distally from the body for gripping an exterior surface of the portable device.

In a yet further aspect of the present invention, the cradling member engages the portable device in a releasable sliding combination.

In yet another aspect of the present invention, a device supporter may comprise a body, including a pair of coupling members and a cradling member, each of the coupling members extending from the body, the coupling members configured to couple a portable device to the body in a spring biasing relationship; and an engaging member, configured for releasable engagement with a stand, the engaging member extending substantially orthogonally in relation to the coupling members, wherein the cradling member is integrally situated distally from the coupling members.

In still yet another aspect of the present invention, a device supporter may comprise a generally rectangular holder base adapted to hold a portable device, the holder base including a pair of coupling members at respective corners of the holder base and a cradling member, wherein the coupling members extend outward and forward to bend over and form an edge that holds a respective corner of the portable device and an engaging member, configured for releasable engagement with a stand, the engaging member extending substantially orthogonally in relation to the coupling members, wherein the cradling member is situated distally from the coupling members.

These and other aspects, objects, features and advantages of the present invention, are specifically set forth in, or will become apparent from, the following detailed description of an exemplary embodiment of the invention when read in conjunction with the accompanying drawings.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

The present invention may involve holding a portable device. The term "portable device" is used herein to include any type of electronic device, including those identified above as examples or portable devices with which the holder can be used.

The present invention may be attached onto a music stand, microphone stand, and other such structures commonly present in venues for public meeting such as concerts, public speeches, press conferences, and the like. The portable device may be slid and snapped into the present invention for hands-free use. The present invention may be used by musicians to display sheet music, chord charts, lyrics, set lists, and the like. Additionally, the present invention may be used by speakers (such as for an outline of a presentation), chefs (such as for displaying recipes or ingredient lists), and many other uses.

The holder may be manufactured by mold injection of thermoplastic material. An engaging member to engage the stand (such as clipping or snapping to a microphone stand) may be formed integrally or separately attached to the body of the holder. The holder may be manufactured for viewing the portable device in a portrait orientation, in a landscape orientation, or in other orientations. Optionally, the holder may be manufactured to easily convert between portrait orientation, landscape orientation, and other orientations.

The holder may be used, in further examples, for directional sound reflecting and baffling, easier grasping by the user, as well as attachment to an automobile, motorcycle, boat, or other vehicles.

The portable device hereinafter described is merely illustrative of one type of device that may benefit from embodiments of the present invention and, therefore, should not be taken to limit the scope of the present invention. While several embodiments of a portable device are illustrated and will be hereinafter described for purposes of example, other types of electronic devices, such as mobile telephones, mobile computers, portable digital assistants (PDAs), tablet computers, GPS navigation devices, pagers, laptop computers, desktop computers, gaming devices, televisions, and other types of electronic systems, may employ the present invention.

Figure 1:
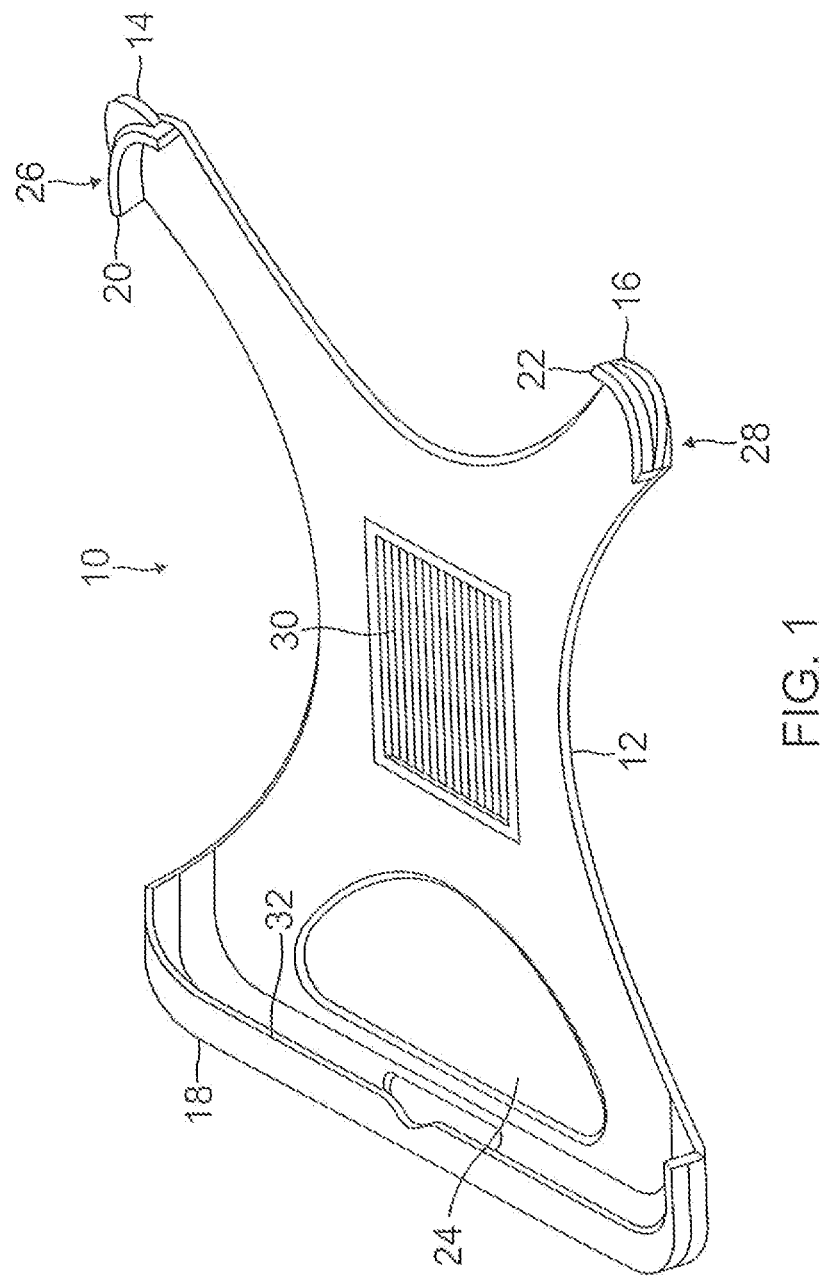
FIG. 1 is a front view of a device supporter, according to an embodiment of the present invention.

Referring now to the drawings in detail, wherein like reference characters refer to like elements, there is shown in FIG. 1 a device supporter 10. The device supporter may comprise a body 12 and include a pair of coupling members 14, 16 and a cradling member 18. The body 12 may include a plurality of corners 26, 28. The body 12 may further comprise an engagement panel 30. The engagement panel 30 may be corrugated, fluted, grooved, bent, channeled, serrated, ridged, folded, furrowed, containing ridges, undulating, pleated, creased, wrinkled, textured, friction device, friction pad, or otherwise formed with a varied surface or structure. The device supporter may have an aperture 24, optionally D-shaped, situated near the cradling member 18. For example, the aperture 24 may be situated between the engagement panel 30 and the cradling member 18. In another example, the aperture 24 may be situated between the engaging member 40 and the cradling member 18.

Each of the coupling members 14, 16 may extend from the body 12 towards corners 26, 28 respectively. Each of the coupling members 14, 16 may be situated proximate to one of the corners 26, 28. The coupling members 14, 16 may comprise gripping members 20, 22 extending distally from the body 12 for gripping an exterior surface of the portable device (not shown). The coupling members 14, 16 may be configured to couple a portable device to the body 12 in a spring biasing relationship.

The cradling member 18 may be situated distally from the coupling members 14, 16, in another embodiment the cradling member 18 may be integral with the body 12 and/or the coupling members 14, 16 such that the cradling member is integrally situated with one or more portions of the device supporter 10. The cradling member 18 may comprise an edge 32, acting as a lip for engagement with and/or retention of a portion of a portable device. The cradling member 18 may engage the portable device in a releasable sliding combination. The cradling member 18 may also be configured to cradle the portable device in a spring biasing relationship.

Figure 3:
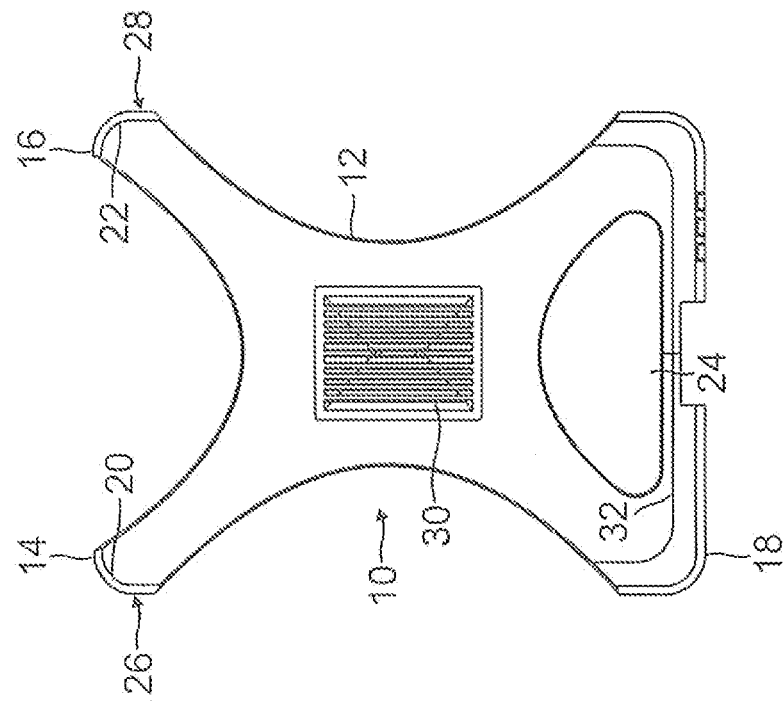
FIG. 3 is a front view of the device supporter of FIG. 2, taken along line A-A, according to an embodiment of the present invention.
Figure 2:
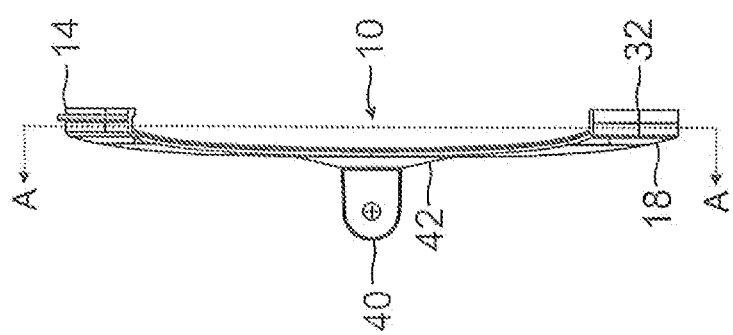
FIG. 2 is a side view of a device supporter, according to an embodiment of the present invention.

FIG. 2 shows a side view of a device supporter 10, An engaging member 40 may be configured for releasable engagement with a stand (not shown). The engaging member 40 may extend substantially orthogonally in relation to the coupling members 14, 16 and/or may be attached to an engaging member portion 42. FIG. 3 is a front view of the device supporter 10 of FIG. 2. taken along line A-A. Engagement panel 30 may be situated on a side opposite from the engaging member 40.

Figure 4:
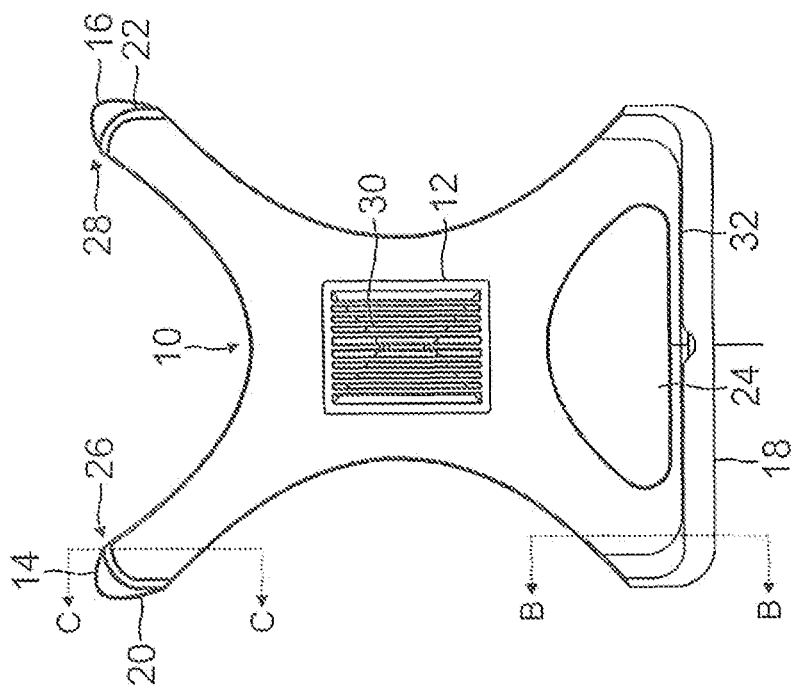
FIG. 4 is a front view of another device supporter, according to an embodiment of the present invention.

FIG. 4 is a front view of another device supporter 10. As shown in FIG. 4, the cradling member 18 and other portions of the device supporter 10 may be differently configured from the examples described elsewhere, such as the example shown in FIG. 3. For example, the coupling members 14, 16 and/or the gripping members 20, 22 may comprise any reasonably useful configuration.

Figure 5:
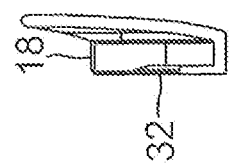
FIG. 5 is a side view of a portion of the device supporter of FIG. 4, taken along line B-B, according to an embodiment of the present invention.

FIG. 5 shows a side view of a portion of the device supporter 10, namely the cradling member 18 with the edge 32 of FIG. 4, taken along line B-B.

Figure 6:
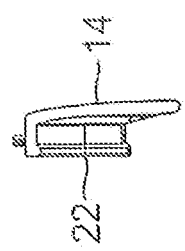
FIG. 6 is a side view of a portion of the device supporter of FIG. 4, taken along line C-C, according to an embodiment of the present invention.

FIG. 6 shows a side view of a portion of the device supporter 10 of FIG. 4, taken along line C-C, to show the coupling member 16 with gripping member 22.

Figure 7:
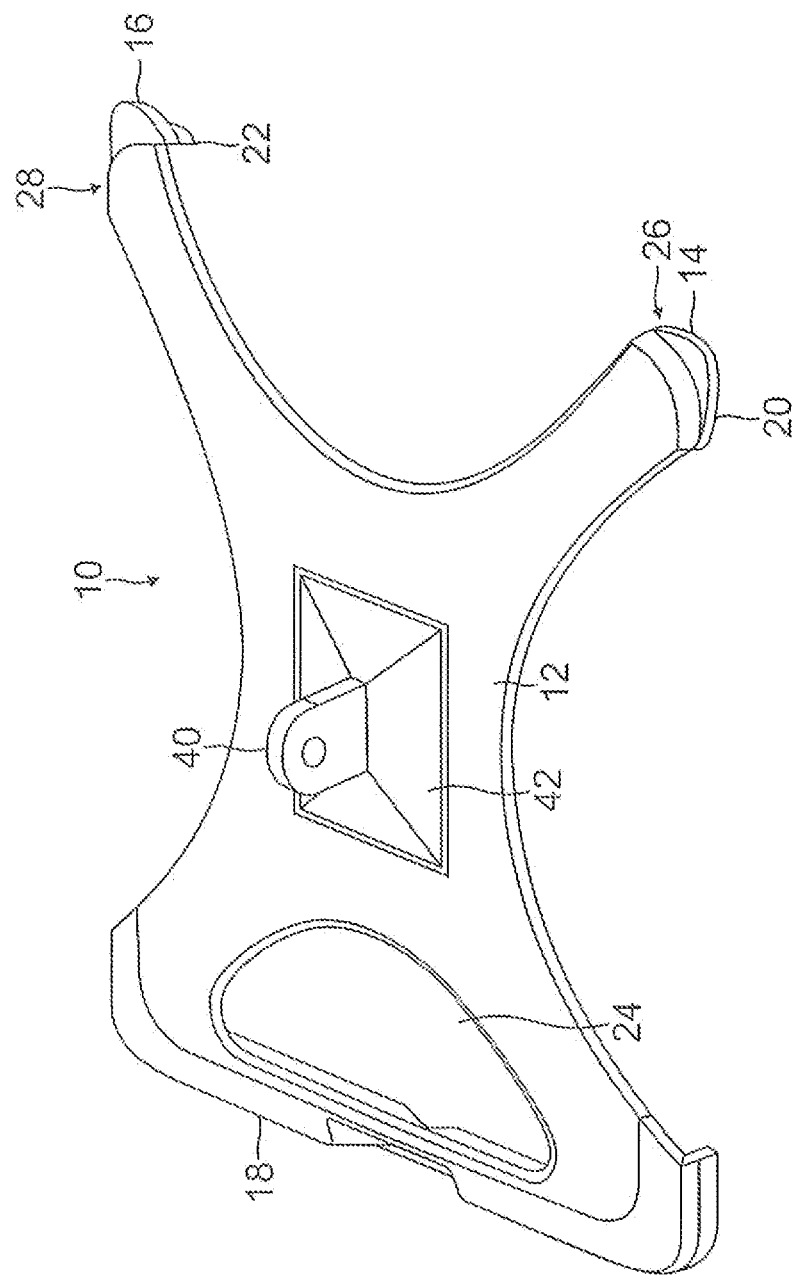
FIG. 7 is a perspective view of a device supporter, according to an embodiment of the present invention.

A device supporter 10 is shown in FIG. 7, from a side opposite from the side of the engagement panel, such as the engagement panel 30 shown in Figure A device supporter 10 may comprise a generally rectangular holder base 12 adapted to hold a portable device, the holder base 12 including a pair of coupling members 14, 16 at respective corners 26, 28 of the holder base 12 and a cradling member 18. The coupling members 14, 16 may extend outward and forward to bend over and form an edge that holds a respective corner of the portable device (not shown). An engaging member 40 may be configured for releasable engagement with a stand, as to be described more fully below regarding FIG. 8. The engaging member 40 may extend substantially orthogonally in relation to the coupling members 14, 16. The cradling member 18 may be situated distally from the coupling members 14, 16.

Figure 8:
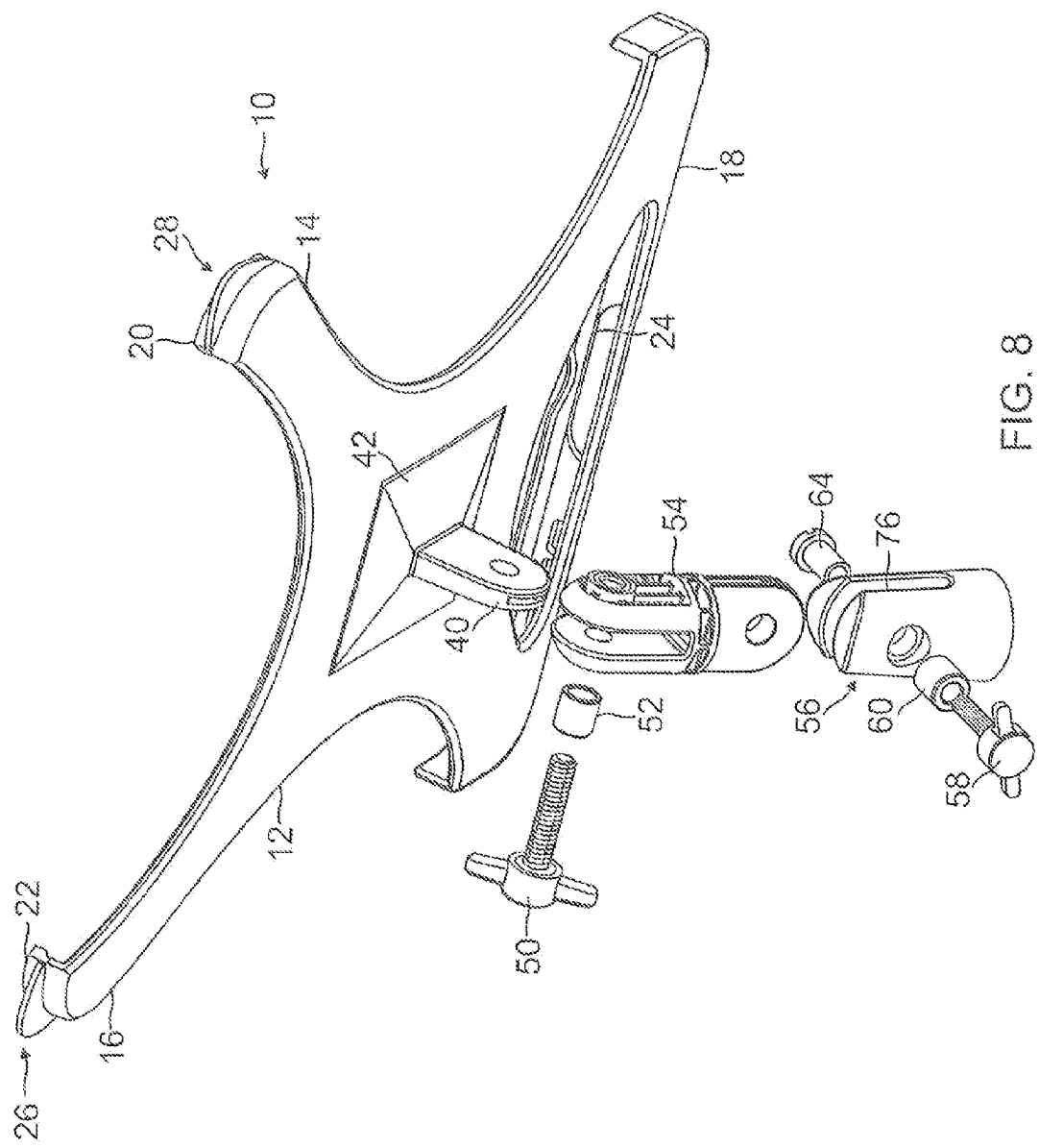
FIG. 8 is a schematic view of a device supporter and an attachment apparatus, according to an embodiment of the present invention.

Referring to FIG. 8, a configuration to support a portable device on a stand, such as a microphone stand, may be accomplished as shown in the schematic view of a device supporter 10 and an attachment apparatus 56. A hand-tightened bolt 50 may be used with a washer or bushing 52 to secure the supporter 10 by securing the engagement member 40 to an attachment adapter 54. In other words, an attachment apparatus 56 may be engaged with the engaging member 40.

The attachment adapter 54 may be situated between the attachment apparatus 56 and the engaging member 40. For example, the attachment adapter, 54 may be secured to the attachment apparatus 56 with a bolt 58, washer or bushing 60, and end cap 64. A portion of the attachment adapter 54 may interface with a slot 76 of the attachment apparatus 56.

Figure 9:
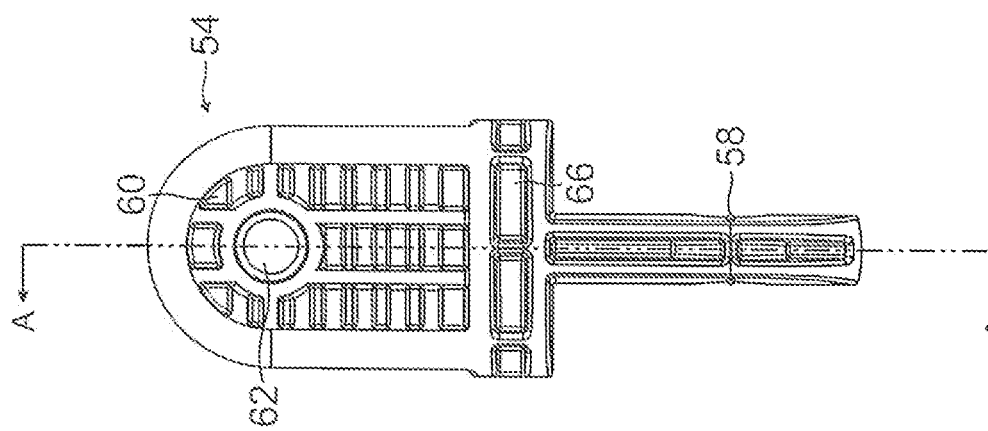
FIG. 9 is an isometric view of an attachment adapter, according to an embodiment of the present invention.

The attachment adapter 54 is shown in isolation in FIG. 9. The attachment adapter 54 may comprise head portion 60, an aperture 62, a flange 66, and a member 58 for interfacing with the device supporter 10 and the attachment apparatus 56.

Figure 11:
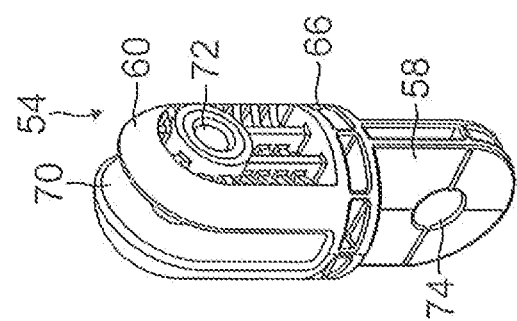
FIG. 11 is a perspective view of an attachment adapter, according to another embodiment of the present invention.
Figure 10:
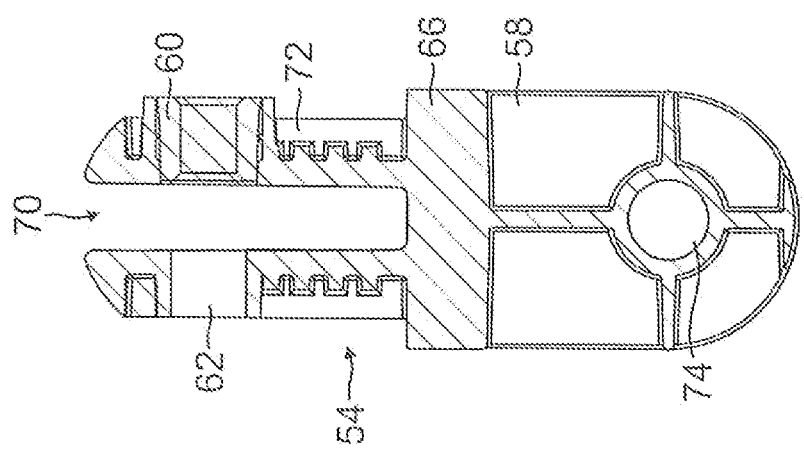
FIG. 10 is a schematic view of an attachment adapter, according to an embodiment of the present invention.

FIG. 10 shows the attachment adapter 54 of FIG. 9, viewed along line A-A, illustrating slot 70, ridges 72, and bottom aperture 74. Another view of the attachment adapter is shown in FIG. 11.

It should be understood, of course, that the foregoing relates to exemplary embodiments of the invention and that modifications may be made without departing from the spirit and scope of the invention as set forth in the following claims.

We claim:

1. A device supporter, comprising:
a body, including a corrugated engagement panel, a pair of coupling members and a cradling member, each of the coupling members extending from the body, the coupling members configured to couple a portable device to the body in a spring biasing relationship; and
an engaging member, configured for releasable engagement with a stand, the engaging member extending substantially orthogonally in relation to the coupling members;
wherein the cradling member is integrally situated distally from the coupling members; and
wherein the body comprises a D-shaped aperture situated between the corrugated engagement panel and the cradling member.

2. The device supporter of claim 1, wherein the body includes a plurality of corners and each of the coupling members is situated proximate to one of the corners.

3. The device supporter of claim 1, wherein the body includes an aperture situated between the D-shaped aperture and the cradling member.

4. The device supporter of claim 1, wherein the coupling members comprise gripping members extending distally from the body for gripping an exterior surface of the portable device.

5. The device supporter of claim 1, wherein the cradling member engages the portable device in a releasable sliding combination.

6. The device supporter of claim 1, wherein the cradling member is configured to cradle the portable device in a spring biasing relationship.

7. A device supporter, comprising:
a generally rectangular holder base adapted to hold a portable device, the holder base including a corrugated engagement panel, a pair of coupling members at respective corners of the holder base, and a cradling member;
wherein the coupling members extend outward and forward to bend over and form an edge that holds a respective corner of the portable device; and
an engaging member, configured for releasable engagement with a stand, the engaging member extending substantially orthogonally in relation to the coupling members;
wherein the cradling member is situated distally from the coupling members; and
wherein the holder base comprises a D-shaped aperture situated between the corrugated engagement panel and the cradling member.

8. The device supporter of claim 7, further comprising an attachment apparatus engaged with the engaging member.

9. The device supporter of claim 8, further comprising an attachment adapter situated between the attachment apparatus and the engaging member.

10. The device supporter of claim 7, wherein the holder base includes a aperture situated between the D-shaped aperture and the cradling member.

11. The device supporter of claim 7, wherein the coupling members comprise gripping members extending distally from the body for gripping an exterior surface of the portable device.

12. The device supporter of claim 7, wherein the cradling member is configured to cradle the portable device in a spring biasing relationship.

13. The device supporter of claim 7, wherein the coupling members are configured to couple a portable device to the body in a spring biasing relationship.

14. An apparatus to support a portable device on a stand, comprising:
a device supporter comprising a body, including a corrugated engagement panel, a pair of coupling members, an engaging member, and a cradling member, each of the coupling members extending from the body, the coupling members configured to couple a portable device to the body in a spring biasing relationship;
wherein the body comprises a first D-shaped aperture situated between the corrugated engagement panel and the cradling member and a second aperture situated between the first D-shaped aperture and the cradling member; and
an attachment adapter secured to the engaging member, the attachment adapter comprising a head portion, an aperture, a flange, and a member interfacing with the device supporter.

15. The apparatus of claim 14, wherein the attachment adapter is situated between an attachment apparatus and the engaging member and the attachment adapter comprises a slot and ridges.

16. The apparatus of claim 15, wherein a portion of the attachment adapter interfaces with a slot of the attachment apparatus.

17. The apparatus of claim 14, wherein the coupling members comprise gripping members extending distally from the body for gripping an exterior surface of the portable device.

18. The apparatus of claim 14, wherein the coupling members are configured to couple a portable device to the body in a spring biased relationship.

* * * * *